US012253256B2

(12) United States Patent
Zhou et al.

(10) Patent No.: US 12,253,256 B2
(45) Date of Patent: Mar. 18, 2025

(54) LIGHT SOURCE MODULE FUNCTIONING AS A USER CONTROL INTERFACE

(71) Applicant: SIGNIFY HOLDING B.V., Eindhoven (NL)

(72) Inventors: Liang Zhou, Shanghai (CN); Chen Hao Kou, Shanghai (CN); Liwen Zhou, Shanghai (CN); Qi Zhang, Shanghai (CN)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/562,420

(22) PCT Filed: May 12, 2022

(86) PCT No.: PCT/EP2022/062922
§ 371 (c)(1),
(2) Date: Nov. 20, 2023

(87) PCT Pub. No.: WO2022/243157
PCT Pub. Date: Nov. 24, 2022

(65) Prior Publication Data
US 2024/0247779 A1    Jul. 25, 2024

(30) Foreign Application Priority Data

May 20, 2021  (WO) ................. PCT/CN2021/094951
Sep. 7, 2021  (EP) ...................................... 21195193

(51) Int. Cl.
*F21V 7/00* (2006.01)
*F21S 6/00* (2006.01)
(Continued)

(52) U.S. Cl.
CPC .............. *F21V 7/005* (2013.01); *F21S 6/003* (2013.01); *F21V 7/0008* (2013.01);
(Continued)

(58) Field of Classification Search
CPC ...... F21V 7/005; F21V 7/0008; F21V 7/0033; F21V 23/005; F21V 23/0485; F21S 6/003;
(Continued)

(56) References Cited

U.S. PATENT DOCUMENTS 9,389,769 B1    7/2016 James
2016/0215964 A1    7/2016 Feit
(Continued)

FOREIGN PATENT DOCUMENTS

CN    112013295 A    12/2020
DE    102017208999 A1    11/2018
(Continued)

*Primary Examiner* — Anne M Hines
*Assistant Examiner* — Jose M Diaz (57) ABSTRACT

A control interface (10) for controlling a system, comprising a module comprising: a carrier (32) having a top surface and an opposite bottom surface; an elongate window formed in, or adjacent, the carrier; an elongate array of light sources (36) on the bottom surface of the carrier; a reflector arrangement (40) for reflecting light from the array of light sources towards the window (38) to escape from the top surface, such that a light path is formed between each light source and the window (38), with a portion of the light paths being parallel to the carrier (32), wherein the light sources are adapted to be turned on in response to a control signal; wherein the module further comprises: a user interface surface (20), comprising a track area (22) for receiving touch input from a user, wherein the window is formed beneath the track area; and a touch sensor circuit (34) beneath the track area (22), wherein the touch sensitive circuit (34) comprises a touch sensor region on the top surface of the carrier (32); and a controller (70) adapted to control the light sources in dependence on a detected location of a touch input.

14 Claims, 7 Drawing Sheets

(51) Int. Cl.
  *F21V 23/00* (2015.01)
  *F21V 23/04* (2006.01)
  *F21Y 103/10* (2016.01)
  *F21Y 115/10* (2016.01)
  *H05B 45/10* (2020.01)

(52) U.S. Cl.
  CPC ........ *F21V 23/005* (2013.01); *F21V 23/0485* (2013.01); *H05B 45/10* (2020.01); *F21Y 2103/10* (2016.08); *F21Y 2115/10* (2016.08)

(58) Field of Classification Search
  CPC .. H05B 45/10; F21Y 2103/10; F21Y 2115/10; H01H 2219/06; H03K 2217/96042
  See application file for complete search history.

(56) References Cited

U.S. PATENT DOCUMENTS

| | | |
|---|---|---|
| 2017/0248289 A1 | 8/2017 | Vasylyev |
| 2017/0291353 A1 | 10/2017 | Sagesaka et al. |
| 2020/0103093 A1* | 4/2020 | Negel .................. B60Q 1/2661 |

FOREIGN PATENT DOCUMENTS

| | | |
|---|---|---|
| EP | 2982541 A2 | 2/2016 |
| GB | 2274160 A | 7/1994 |
| WO | 2009116778 A2 | 9/2009 |
| WO | 2012062347 A1 | 5/2012 |
| WO | 2019002012 A1 | 1/2019 |

\* cited by examiner

LIGHT SOURCE MODULE FUNCTIONING AS A USER CONTROL INTERFACE

CROSS-REFERENCE TO PRIOR APPLICATIONS

This application is the U.S. National Phase application under 35 U.S.C. § 371 of International Application No. PCT/EP2022/062922, filed on May 12, 2022, which claims the benefit of International Application No. PCT/CN2021/094951, filed on May 20, 2021 and European Patent Application Ser. No. 21/195,193.4, filed on Sep. 7, 2021. These applications are hereby incorporated by reference herein.

FIELD OF THE INVENTION

This invention relates to modules which incorporate light sources.

BACKGROUND OF THE INVENTION

Light source modules are used in many different applications. This invention relates in particular to a light source module which is desired to have a low profile, for example so that it may form part of a surface of a device. For example, a user interface area of a device may be desired to have a low profile so that it can be integrated into the outer housing of a device to be controlled.

There are many other lighting applications where lighting is to be provided using a surface-mounted module, or a module integrated into a surface, and it is desired to take up a minimum of space behind the lighting module. Examples include automotive lighting, for example as shown in DE 102017208999 A1.

When using LED lighting, if a direct light output is provided from LEDs, the light output will be seen as separate spots, in particular if an elongate light of light sources is used. To create a more uniform light output, optical components are needed and/or a significant light path length in needed for the native LED light output to spread. These requirements increase the size of the light source module.

There is therefore a need for a light module design which is space efficient and can provide a desired uniformity of light output.

SUMMARY OF THE INVENTION

The invention is defined by the claims.

According to examples in accordance with an aspect of the invention, there is provided a module, comprising:
  a carrier having a top surface and an opposite bottom surface;
  an elongate window formed in, or adjacent, the carrier;
  an elongate array of light sources on the bottom surface of the carrier;
  a reflector arrangement for reflecting light from the array of light sources towards the window to escape from the top surface, such that a light path is formed between each of the light sources and the window, with a portion of the light paths being parallel to the carrier, wherein the light sources are adapted to be turned on in response to a control signal.

This system is compact by mounting the light sources on an underside of a carrier, such as a printed circuit board, to emit light downwardly or laterally. The downward or lateral light is reflected and passed through a window. A light path is provided within the reflector arrangement having a portion parallel to the carrier, so that a desired path length between the light sources and the window is in the plane of the carrier. In this way, the desired path length (to provide desired beam expansion between the light sources and the window) does not take up vertical space. The system is able to provide a pleasant appearance as well as enabling integration into a small vertical (i.e. depth dimension) space.

The reflector arrangement functions as a light guide, and the light escapes from the light guide from the top surface of the carrier through the window. The window thus provides a light path across the carrier, so that the carrier can be opaque, and the light output is confined to the area formed by the window.

The window shape dictates the shape of the generated light output.

The system may be used in any application where a light output is desired from a structure with a low depth. This applies to any light output system for integration into a surface, such as lighting of a control panel, vehicle lighting etc.

The window may be an opening through the carrier or a gap between the carrier and a surrounding housing.

The module may further comprise a diffuser mounted in or over the window for diffusing the reflected light.

The downward or lateral light is thus reflected and passed through a diffuser, so that the lighting appears continuous.

The reflector arrangement may comprise a cavity arrangement formed beneath the array of light sources. The cavity arrangement provides reflecting surfaces to redirect the light output from the light sources.

The cavity arrangement may comprise a respective cavity area beneath each light source. Thus, the light output from each light source is directed by its own respective cavity area.

The internal walls of the cavity are preferably all reflective, such as six walls forming a generally cuboid or trapezoidal prism shape. One wall (defining the top surface of the cavity) has a window through which light can escape.

The window may comprise a slit, such as straight line, a curved line, a closed shape or a more complex shape for example with a non-constant slit width. The reflector arrangement may then comprise separation walls between the cavity areas along the length of the slit.

These separation walls isolate the light output from the different light sources so that a sharp transition may be provided between light sources that are turned on to light sources that are turned off, along a line. Thus, a selected length of the slit may be chosen to be illuminated.

The light sources for example emit light in a direction perpendicularly away from the carrier, and in one example each cavity area has a first 45 degree side wall beneath the respective light source and a second 45 degree side wall beneath the window.

Assuming specular reflective surfaces, these side walls together provide a 180 degree reflection. The light sources are downwardly emitting so that two 90 degree reflections (using 45 degree side walls) are provided.

However, the surfaces may be diffuse reflective surfaces. The surface angles may then fall in a range, such as 20 degrees to 70 degrees.

The space between the side walls defines the portion of the light path travelling in a sideways direction such as parallel to the carrier.

In another implementation, the light sources emit light laterally in a direction parallel to the carrier, and in one example each cavity area may then have a 45 degree side wall beneath the window and in the path of the laterally emitted light.

Again, assuming a specular reflective surface, these single side walls thus provide a 90 degree reflection. The light sources are side emitting so that one 90 degree reflection (using 45 degree side walls) is provided.

The space between the light sources and the side walls in this case defines the portion of the light path travelling in a sideways direction such as parallel to the printed circuit board.

All inner surfaces of the cavity areas may be reflective (apart from at the window) to form a light mixing chamber. This may be used to improve uniformity. The surfaces for example are then diffuse reflective surfaces so that the surface angles may again fall in a range, such as 20 degrees to 70 degrees.

The portion of the light path in the sideways direction is for example longer than the remainder of the light path between the light sources and the window. Thus, most of the light path is implemented by sideways light which may for example have been reflected by a side wall of the cavity area.

The array of light sources for example comprises an array of LEDs, and the carrier is a PCB.

The invention also provides a control interface for controlling a system, comprising:
  the module defined above, wherein the module further comprises:
    a user interface surface, comprising a track area for receiving touch input from a user, wherein the window is formed beneath the track area; and
    a touch sensitive circuit beneath the track area, wherein the touch sensitive circuit comprises a touch sensor region on the top surface of the carrier; and
  a controller adapted to control the light sources in dependence on a detected location of a touch input.

The module is thus used as an illuminated user interface, used for controlling another (main) lighting system.

This control interface provides touch sensing and illumination, so that a control setting provided by touching the track area can be displayed to a user by illuminating the track area by means of the module defined above. The top side of the carrier is used for the touch sensing and the bottom side carries the light sources. The lighting of the track appears continuous.

The controller is for example adapted to illuminate the light sources from one end of the track area up to the detected location. Thus, the length of illuminated track represents a control setting, such as a brightness setting for a main lighting system to be controlled by the control interface.

The invention also provides a lighting system comprising:
  a main light source; and
  a control interface as defined above for controlling the main light source of the lighting system,
  wherein the controller is adapted to control the main light source in dependence on the detected location of a touch input.

The controller is for example adapted to control a dimming level of the main light source in dependence on the detected location of the touch input.

The lighting system may comprise a desk lamp.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

The invention provides a module comprising a carrier having a top surface and an opposite bottom surface and an elongate array of light sources on the bottom surface of the carrier. A reflector arrangement reflects light from the array of light sources along a light path towards a window to escape from the top surface. A portion of the light path is parallel to the carrier (i.e. in a sideways direction) so that the depth of the module is reduced.

As a minimum, the module of the invention comprises a light source array mounted on a carrier and a reflector arrangement.

One application of particular interest is for an illuminated user interface, in which there is also a touch sensor system, and the touch area is illuminated as a function of the setting selected by the user.

Figure 1:
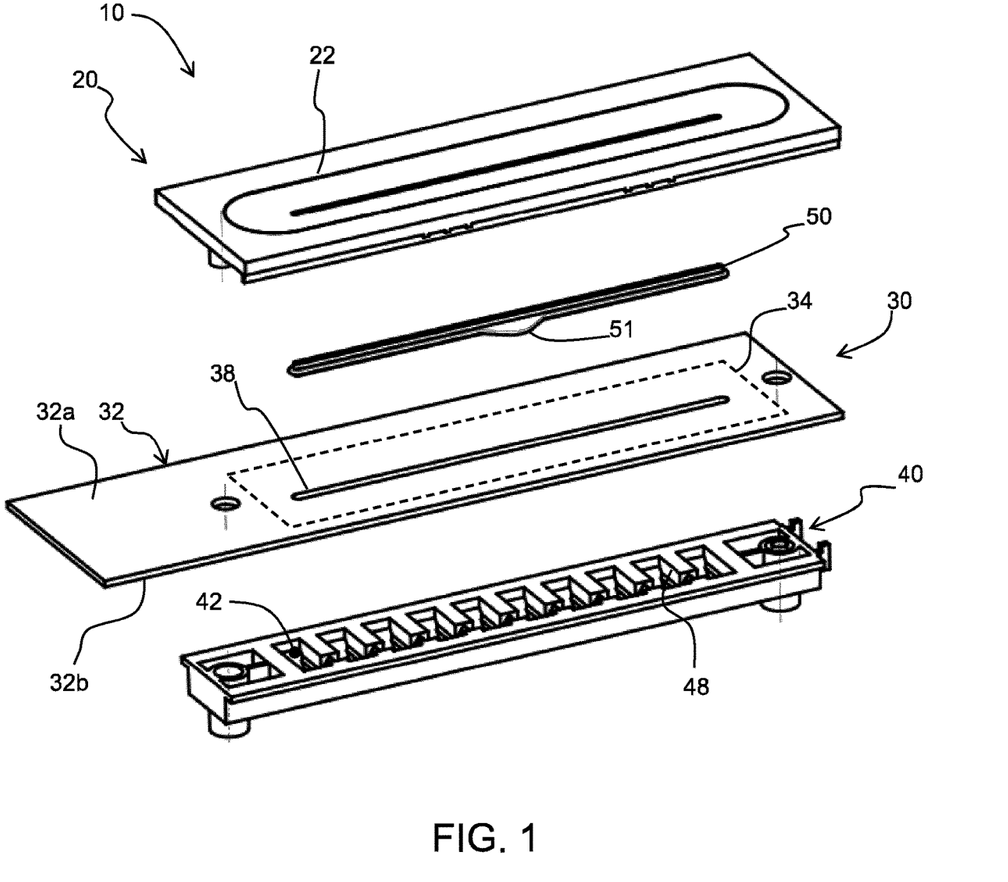
FIG. 1 shows an example of a module with touch sensing functionality, in exploded form from above.

FIG. 1 shows an example of a module with this touch sensing functionality.

The module 10 comprises a light source unit 30 comprising a carrier 32 having a top surface 32a and an opposite bottom surface 32b. The carrier is in this example a printed circuit board. An elongate window 38 is formed in the carrier formed as a slit. This window is an opening through the carrier, but it may instead be an open area adjacent an edge of the carrier 32.

The light source unit 30 further comprises an elongate array of light sources such as LEDs provided on the bottom surface 32b of the carrier 32.

Beneath the carrier, there is a reflector arrangement 40 for reflecting light from the array of light sources back towards the window 38, so that the light can escape from the top surface 32a.

Figure 2:
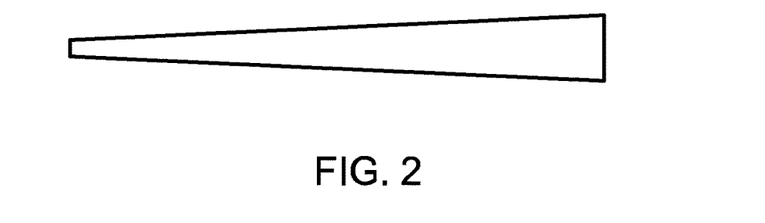
FIG. 2 shows one possible shape of the light output generated by the module.

The reflector arrangement 40 functions as a light guide. Light enters the light guide from the light sources, and the light escapes from the light guide to the top surface of the carrier 30 through the window 38. The window thus provides a light path through the carrier, so that the carrier can be opaque, and the light output is confined to the area formed by the window 38. The width of the light effect is controlled by the width of the window 38 and the diffuser 50. The lighting effect may have a constant width along the window or it may have a width which varies along the length of the window, for example as shown in FIG. 2.

Returning to FIG. 1, within the reflector arrangement, a light path is formed between the light sources and the window 38. At least part of this light path is parallel to the carrier 32, so that part of the length of the light path is implemented as laterally directed light, which does not take up depth of the module.

The light sources are turned on in response to a control signal, in particular so that a desired length of an illuminated line (along the window) can be selected. Dynamic lighting effects can also be created.

The reflector arrangement comprises a line of reflecting cavities 42 together forming a cavity arrangement, discussed further below.

The light source unit 30 and reflector arrangement are the minimum parts needed to provide a light output system. However, FIG. 1 additionally shows a diffuser 50 for mounting in or over the window 38 for diffusing the reflected light. The downward or lateral light output by the light sources is thus reflected and passed through the diffuser, so that the lighting delivered along the length of the window appears continuous.

In the example of FIG. 1, the light source unit 30 also comprises a touch sensor circuit 34 formed on the top side 32a of the carrier 32. In this case, the module forms a control interface for controlling another system. That other system may for example comprise a lighting system with its own main light source. The control interface may then be used for controlling the main light source, such as for controlling a dimming level.

A user interface surface 20 is provided over the light source unit 30, having a track area 22 for receiving touch input from a user. The window 38 in the carrier is formed beneath the track area, so that the track area is illuminated by the light sources. In the example shown, the diffuser has a mounting tab 51 with a fixing hole for fixing the diffuser to the user interface surface 20.

The touch sensor circuit 34 is also beneath the track area 22 so that the location of a touch input along the track area can be detected, by a well-known touch sensor circuit. A capacitive or resistive (pressure based) touch sensor circuit may be employed.

A controller is then adapted to control the light sources in dependence on a detected location of a touch input. In this way, a touch input may be provided to the module, and the track is illuminated to show and hence confirm the user selection that had been made.

The light sources are for example illuminated from one end of the track area up to the detected location at which a touch input has been provided. Thus, the length of illuminated track represents a control setting, such as the brightness setting for a main lighting system. When the light output has a tapered shape as shown in FIG. 2, the width of the end of the illuminated region also represents the brightness setting.

Figure 3:
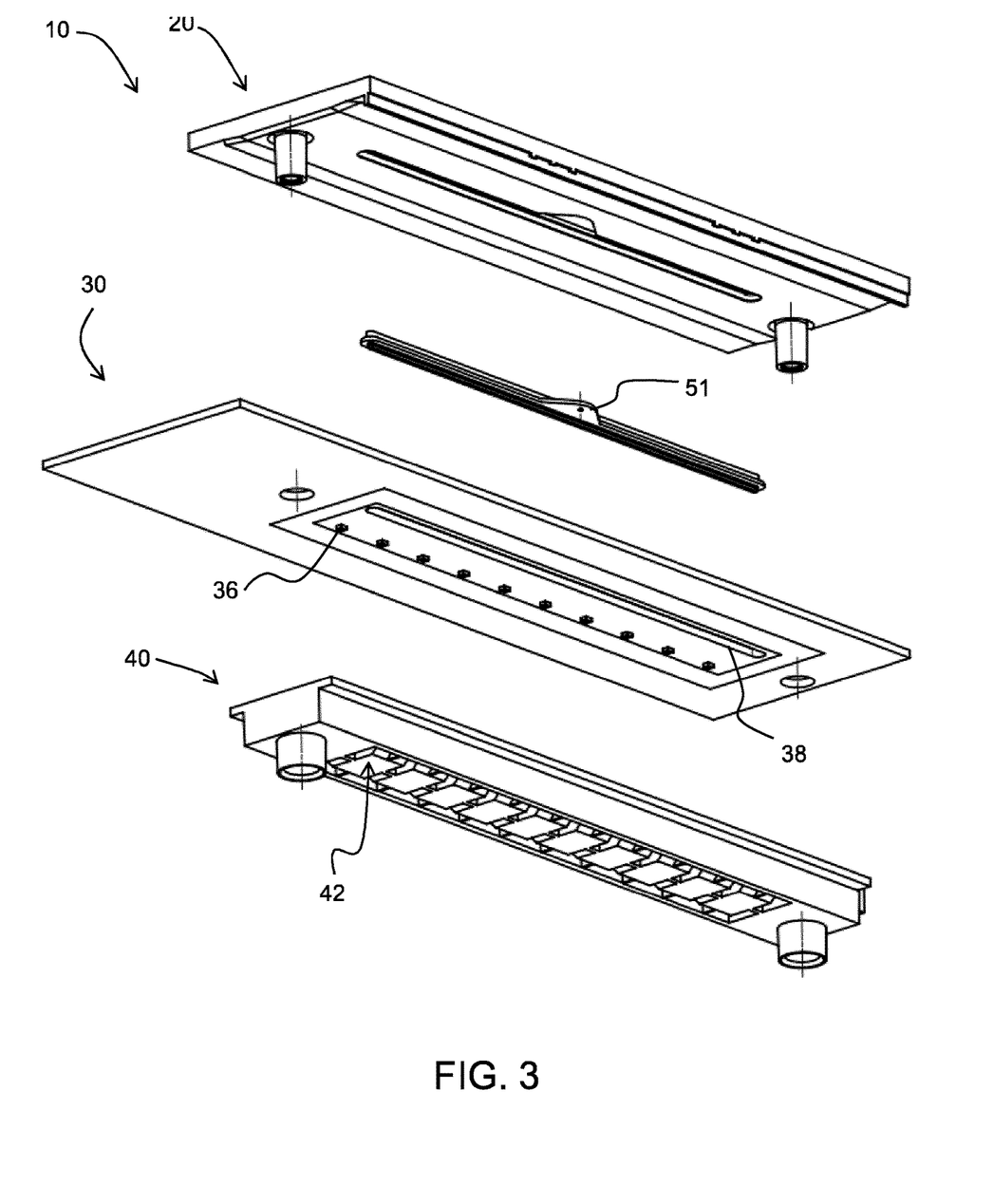
FIG. 3 shows the module of FIG. 1 in exploded form from below.

FIG. 3 shows the module of FIG. 1 from below. It shows the LEDs 36 at the underside of the light source unit 30. They provide light into the reflector arrangement 40.

Figure 4:
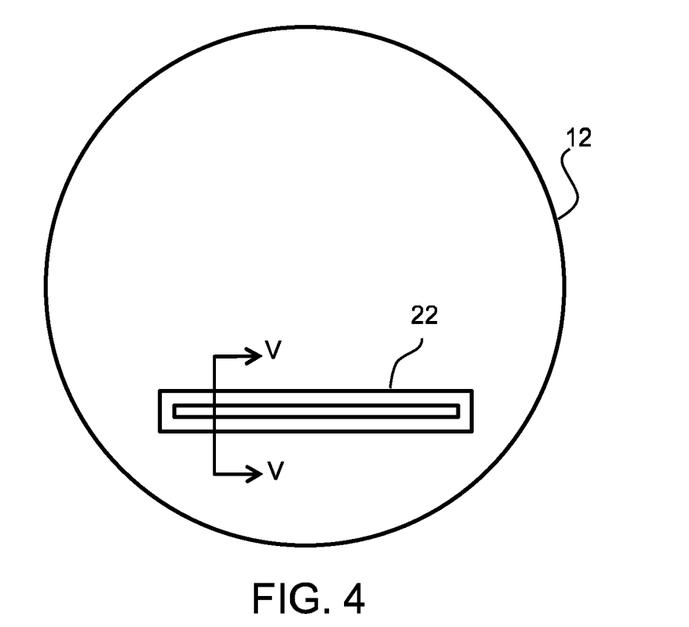
FIG. 4 shows the module of FIG. 1 integrated into a surface, such as a base of a table lamp, to illustrate a first cross section.

FIG. 4 shows the module of FIGS. 1 and 3 integrated into a surface, such as a base 12 of a table lamp. The illuminated track area 22 is shown.

Figure 5:
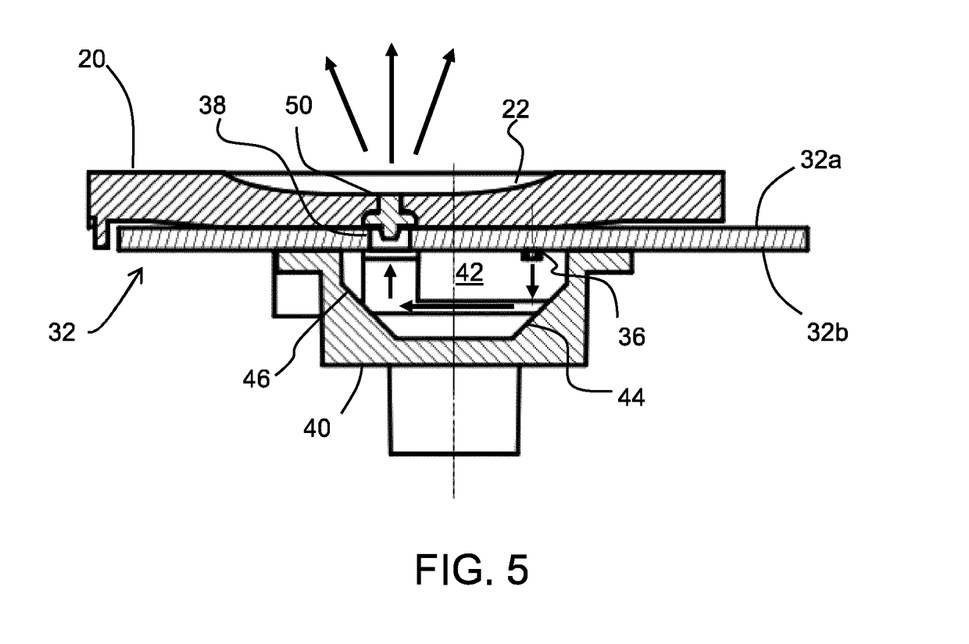
FIG. 5 shows a cross section through one of the light sources as indicated in FIG. 4.

FIG. 5 shows a cross section identified as V-V in FIG. 4, perpendicular to the length of the window (i.e. across the slit).

FIG. 5 in particular shows a cross section through one of the light sources 36 (LEDs) on the bottom side 32b of the carrier, and which are spaced along the track area. An individual cavity area 42 of the reflector arrangement 40 is shown beneath one particular light source 36.

In this example, the light sources emit light in a direction perpendicularly away from the carrier 32, i.e. downward emitting LEDs are used.

This example assumes specular reflective inner surfaces of each cavity. In this example, the cavity area 42 has a first 45 degree (or near 45 degree) side wall 44 beneath the light source 36 and a second 45 degree (or near 45 degree) side wall 46 beneath the window 38. The two side walls together provide a 180 degree reflection, as two 90 degree reflections using the 45 degree side walls. Between the two side walls 44,46 there is a light path which is parallel to the carrier 32. Thus, this portion of the overall light path from the light source 36 to the window 38 does not take up depth of the module.

Note that in this example, separate cavities are not essential—there could be one cavity which extends the length of the window, because the light output from each LED is directed to a respective part of the window.

However, as described below, the surfaces of the cavity may instead be diffuse reflective to form a mixing chamber. A more uniform light illuminates the diffuser, which then determines the light output characteristics. Separate cavities, as shown, are then desired so that each LED is constrained to deliver its light output to a particular portion of the window.

In an alternative example, the light sources can emit light laterally in a direction parallel to the carrier, e.g. using side-emitting LEDs. For a similar example using specular reflective surfaces, each cavity area 42 then only needs a single 45 degree (or near 45 degree) side wall beneath the window 38, in the path of the laterally emitted light. The space between the light source and the side wall in this case defines the portion of the light path parallel to the carrier 32.

The portion of the light path which is parallel to the carrier 32 is for example longer than the remainder of the light path between the light sources and the window. Thus, most of the light path is implemented by sideways light which has been reflected by a highly reflective side wall.

Figure 6:
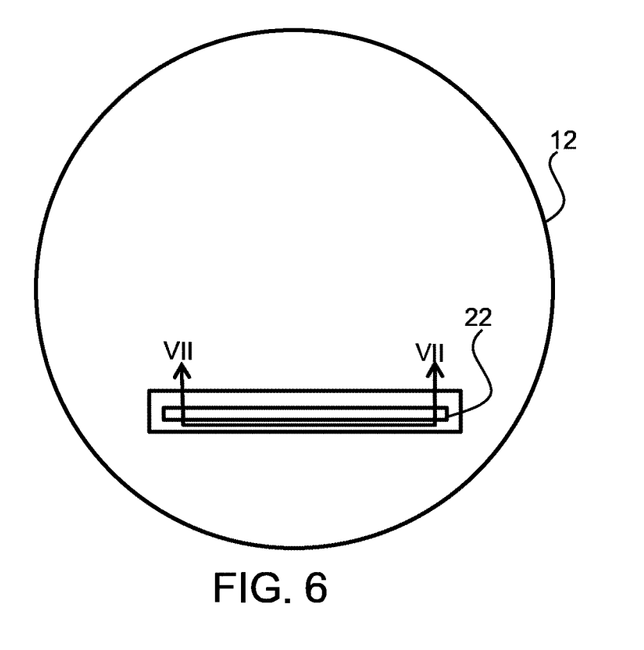
FIG. 6 shows the module of FIGS. 1 and 3 integrated into a surface, such as a base of a table lamp, to illustrate a second cross section.

FIG. 6 again shows the module of FIGS. 1 and 3 integrated into a surface, such as a base 12 of a table lamp. FIG.

Figure 7:
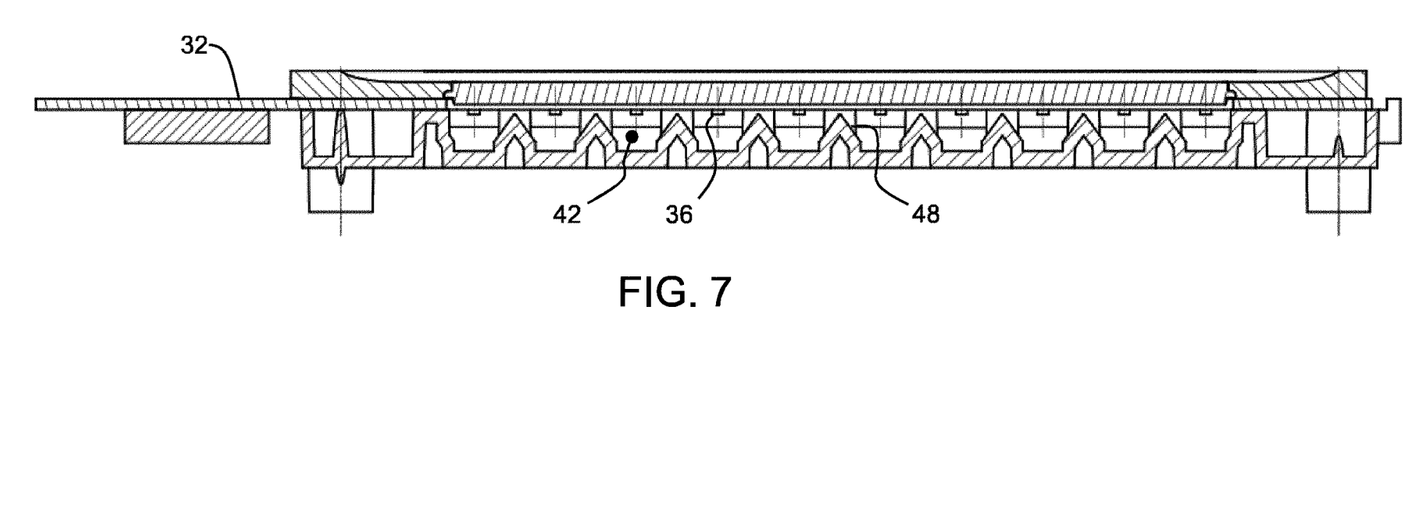
FIG. 7 shows a cross section parallel to the length of the window as indicated in FIG. 6.

7 shows a cross section identified as VII-VII in FIG. 4 parallel to the length of the window (i.e., along the slit).

FIG. 7 shows that the reflector arrangement comprises separation walls 48 between cavity areas 42 along the length of the slit. The separation walls 48 isolate the light output from the different light sources so that a sharp transition may be provided between light sources that are on to light sources that are off, along the slit. Thus, a selected length of the slit may be chosen to be illuminated. The separation walls are also reflective.

Figure 8:
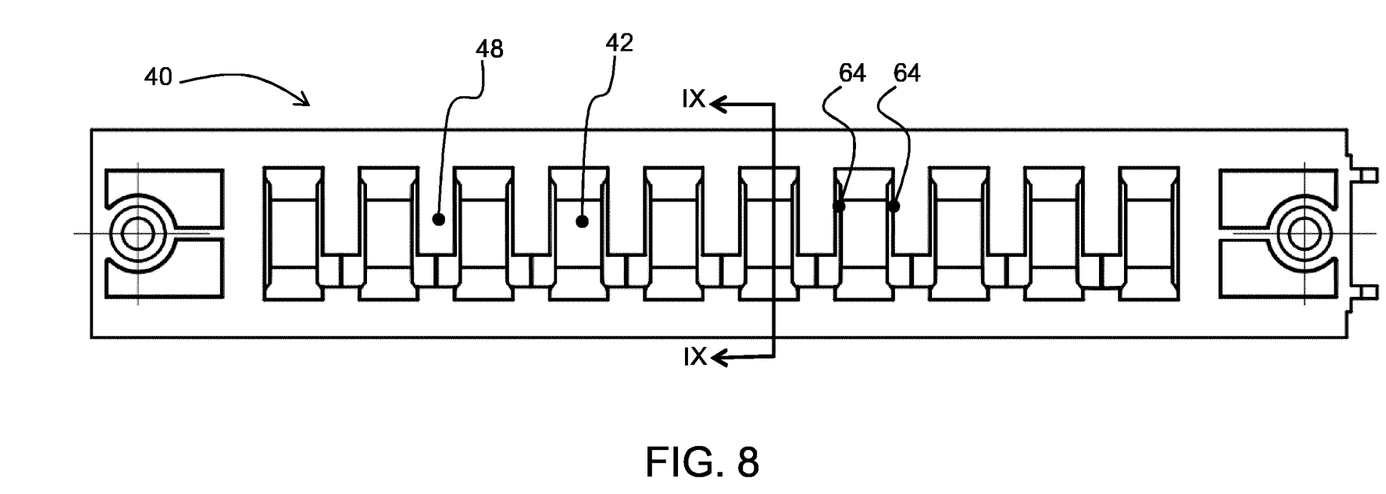
FIG. 8 shows another design of the reflector arrangement for use in the module of FIGS. 1 and 3.

FIG. 8 shows another example of reflector arrangement from above, showing the line of cavities and separation walls 48.

Figure 9:
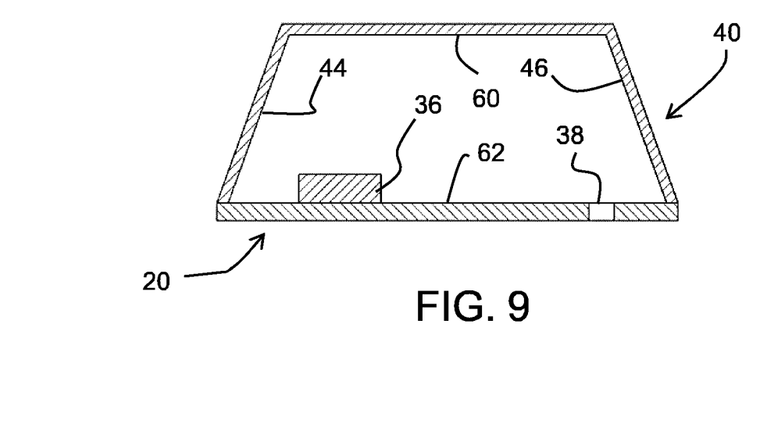
FIG. 9 shows a cross section through the reflector arrangement of FIG. 8.

FIG. 9 shows a cross section through the reflector arrangement (shown as IX-IX in FIG. 8) and the user interface surface 20 which carries the LEDs 36. The cavity has sloped side walls 44, 46 as described above but also a reflective base 60. The cavity also has a reflective top 62, which is defined by the underside of the user interface surface 20. The window 38 is formed in this top part of the cavity.

The cavity also has reflective end walls, shown as 64 in FIG. 8 but not visible in the cross section of FIG. 9. Thus, there are six walls forming a generally trapezoidal prism shape and they are all reflective to form a light mixing structure.

The walls may all be diffuse reflective, and the side walls for example are sloped with an angle in the range 20 degrees to 70 degrees. There may be a combination of specular and diffuse reflective side walls.

Thus, the reflector arrangement may implement controlled reflections towards the window, needing only one or two specular reflective side walls, or it may create a light mixing chamber with all internal surfaces being reflective but requiring less control of the light path angles to the window.

Figure 10:
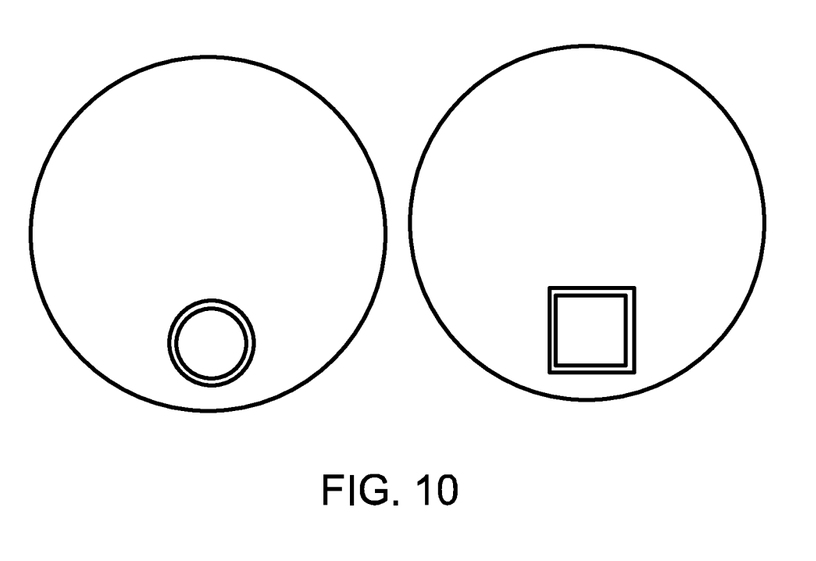
FIG. 10 shows two examples of closed shape for the window.

A line of LEDs and a straight slit shaped window are shown and described above. However, the lines do not need to be straight. The window and array of light sources may form a straight line, a curved line, a closed shape or indeed any other desired shape. The width of the slit be non-uniform along its length as explained with reference to FIG. 2, and it may have any desired shape, not limited to a gradual and uniform taper as shown in FIG. 2. Two examples of closed shape are shown in FIG. 10.

As explained above, the module may be part of a control interface for another device, such as a main light source to be controlled by the control interface.

Figure 11:
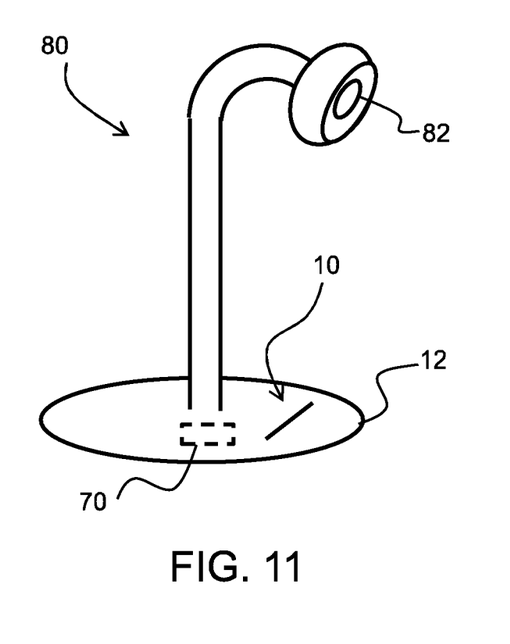
FIG. 11 shows lighting system in the form of a table lamp using the module.

FIG. 11 shows lighting system 80 in the form of a table lamp, comprising a main light source 82 (i.e., for generating the main task lighting of the table lamp) and a module 10 as described above. The table lamp has a controller 70 which controls the main light source 82 in dependence on the detected location of a touch input. For example, the controller 70 controls a dimming level of the main light source 82 in dependence on the detected location of the touch input.

The control interface may be used for controlling any main system, and is not limited to the control of a lighting system. It may be used to provide a control setting for lighting, heating, appliance control, industrial equipment control, etc.

As explained above, the integration of the module into a touch sensor system is only one possible application of the module. The module may itself be a main lighting system, and the control of the light sources is simply to provide a desired light output.

Figure 12:
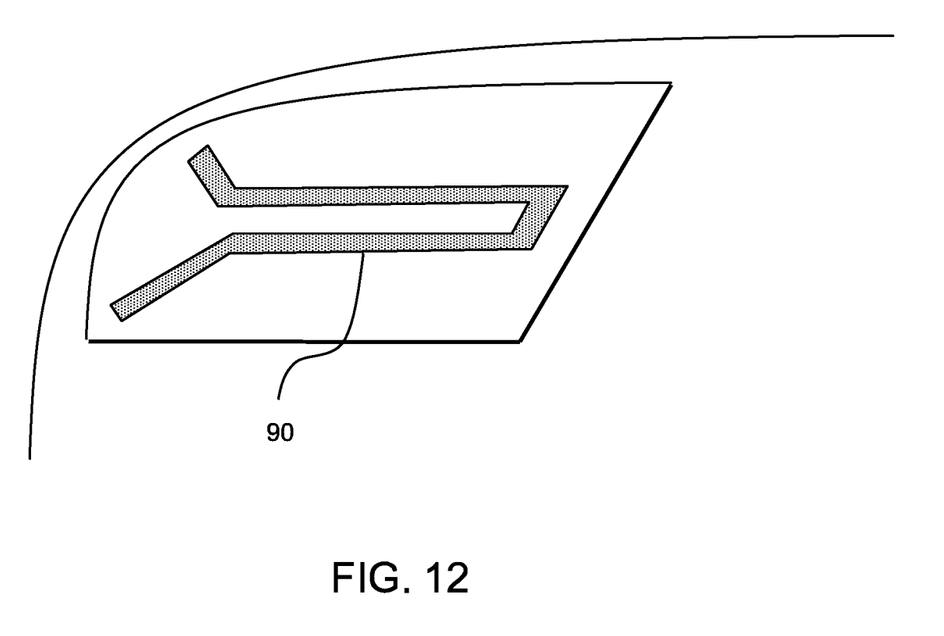
FIG. 12 shows an example of a rear indicator light for a vehicle using the module.

FIG. 12 shows an example of a rear indicator light 90 for a vehicle. It is common to provide such lighting as line of illumination rather than a single spot, and dynamic effects (in addition to simple flashing) are used to make the lighting effect more noticeable, for example with progressively increasing and decreasing lengths of illumination.

The module described above, such as the light source unit (without touch sensor function), reflector arrangement and preferably also the diffuser may be used to implement the indicator light, with a low unit depth and desired lighting uniformity.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

The mere fact that certain measures are recited in mutually different dependent claims does not indicate that a combination of these measures cannot be used to advantage.

If the term "adapted to" is used in the claims or description, it is noted the term "adapted to" is intended to be equivalent to the term "configured to".

Any reference signs in the claims should not be construed as limiting the scope.

The invention claimed is:

1. A control interface for controlling a system, comprising a module comprising:
   a carrier having a top surface and an opposite bottom surface;
   an elongate window formed in, or adjacent, the carrier;
   an elongate array of light sources on the bottom surface of the carrier;
   a reflector arrangement for reflecting light from the array of light sources towards the window to escape from the top surface, such that a light path is formed between each light source and the window, with a portion of the light paths being parallel to the carrier, wherein the light sources are adapted to be turned on in response to a control signal;
   wherein the module further comprises:
      a user interface surface, comprising a track area for receiving touch input from a user, wherein the window is formed beneath the track area; and
      a touch sensor circuit beneath the track area, wherein the touch sensitive circuit comprises a touch sensor region on the top surface of the carrier; and
   a controller adapted to control the light sources in dependence on a detected location of a touch input.

2. The control interface of claim 1, wherein the module further comprises a diffuser mounted in or over the window for diffusing the reflected light.

3. The control interface of claim 1, wherein the reflector arrangement comprises a cavity arrangement formed beneath the array of light sources.

4. The control interface of claim 3, wherein the cavity arrangement comprises a respective cavity area beneath each light source.

5. The control interface of claim 4, wherein the window comprises a slit with uniform or non-uniform slit width.

6. The control interface of claim 5, wherein the reflector arrangement comprises separation walls between the cavity areas along the length of the slit.

7. The control interface of claim 4, wherein:
   the light sources emit light in a direction perpendicularly away from the carrier, and each cavity area has a first 45 degree side wall beneath the respective light source and a second 45 degree side wall beneath the window; or the light sources emit light laterally in a direction parallel to the carrier, and each cavity area has a 45 degree side wall beneath the window and in the path of the laterally emitted light.

8. The control interface of claim 4, wherein all inner surfaces of the cavity areas are reflective to form a light mixing chamber.

9. The module of claim 7, wherein the portion of the light path is longer than the remainder of the light path between the light sources and the window.

10. The control interface of claim 1, wherein the array of light sources comprises an array of LEDs, and the carrier is a PCB.

11. The control interface of claim 1, wherein the controller is adapted to illuminate the light sources from one end of the track area up to the detected location.

12. A lighting system comprising:
 a main light source; and
 a control interface as claimed in claim 1 for controlling the main light source of the lighting system,
 wherein the controller is adapted to control the main light source in dependence on the detected location of a touch input.

13. The lighting system of claim 12, wherein the controller is adapted to control a dimming level of the main light source in dependence on the detected location of the touch input.

14. The lighting system of claim 12, comprising a desk lamp.

\* \* \* \* \*